(12) United States Patent
Daimon

(10) Patent No.: US 11,245,384 B2
(45) Date of Patent: Feb. 8, 2022

(54) MULTIPLEXER, RADIO-FREQUENCY FRONT END CIRCUIT, AND COMMUNICATION DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 43 days.

(21) Appl. No.: 16/831,875

(22) Filed: Mar. 27, 2020

(65) Prior Publication Data
US 2020/0228099 A1   Jul. 16, 2020

Related U.S. Application Data

(63) Continuation of application No. PCT/JP2018/035998, filed on Sep. 27, 2018.

(30) Foreign Application Priority Data

Sep. 29, 2017 (JP) .............................. JP2017-192112

(51) Int. Cl.
*H03H 9/64* (2006.01)
*H03H 9/02* (2006.01)
(Continued)

(52) U.S. Cl.
CPC ...... *H03H 9/6483* (2013.01); *H03H 9/02015* (2013.01); *H03H 9/02228* (2013.01);
(Continued)

(58) Field of Classification Search
CPC ............ H03H 9/6483; H03H 9/02015; H03H 9/02228; H03H 9/02275; H03H 9/14541;
(Continued)

(56) References Cited

U.S. PATENT DOCUMENTS

2005/0190014 A1* 9/2005 Saitou ................ H03H 9/02637
                                                                    333/195
2011/0187478 A1   8/2011 Link et al.
(Continued)

FOREIGN PATENT DOCUMENTS

JP   10-145183 A   5/1998
JP   10-270981 A   10/1998
(Continued)

OTHER PUBLICATIONS

Official Communication issued in International Patent Application No. PCT/JP2018/035998, dated Nov. 13, 2018.
(Continued)

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

A first filter of a multiplexer includes a ladder filter structure with a plurality of series resonators and a plurality of parallel resonators. Each resonator is an acoustic wave resonator that includes an InterDigital Transducer (IDT) electrode including a pair of comb-shaped electrodes. A total number of reflection electrode fingers of the reflectors of at least one of the series resonator that is closest to the common terminal among the series resonators and the parallel resonator that is closest to the common terminal is smaller than a total number of reflection electrode fingers of the reflectors of each of a remainder of the resonators.

18 Claims, 8 Drawing Sheets

(51) Int. Cl.
*H03H 9/145* (2006.01)
*H03H 9/25* (2006.01)
*H04B 1/04* (2006.01)

(52) U.S. Cl.
CPC .... *H03H 9/02275* (2013.01); *H03H 9/14541* (2013.01); *H03H 9/25* (2013.01); *H03H 9/6406* (2013.01); *H04B 1/0458* (2013.01)

(58) Field of Classification Search
CPC .... H03H 9/25; H03H 9/6406; H03H 9/02834; H03H 9/6489; H03H 9/725; H03H 9/02574; H03H 9/14502; H03H 9/6413; H03H 9/72; H03H 7/38; H04B 1/0458; H04B 1/006
USPC ......................................... 333/133, 193–196
See application file for complete search history.

(56) References Cited

U.S. PATENT DOCUMENTS

| | | | |
|---|---|---|---|
| 2013/0285768 | A1 | 10/2013 | Watanabe et al. |
| 2017/0222624 | A1* | 8/2017 | Kishino ............. H03H 9/02685 |
| 2018/0123565 | A1 | 5/2018 | Takamine |

FOREIGN PATENT DOCUMENTS

| | | |
|---|---|---|
| JP | 10-270982 A | 10/1998 |
| JP | 2005-295203 A | 10/2005 |
| JP | 2012-501564 A | 1/2012 |
| WO | 2012/086639 A1 | 6/2012 |
| WO | 2016/208677 A1 | 12/2016 |

OTHER PUBLICATIONS

Official Communication issued in corresponding Korean Patent Application No. 10-2020-7007315, dated Jun. 24, 2021.

* cited by examiner

MULTIPLEXER, RADIO-FREQUENCY FRONT END CIRCUIT, AND COMMUNICATION DEVICE

CROSS REFERENCE TO RELATED APPLICATIONS

This application claims the benefit of priority to Japanese Patent Application No. 2017-192112 filed on Sep. 29, 2017 and is a Continuation Application of PCT Application No. PCT/JP2018/035998 filed on Sep. 27, 2018. The entire contents of each application are hereby incorporated herein by reference.

BACKGROUND OF THE INVENTION

1. Field of the Invention

The present invention relates to a multiplexer that includes filters including acoustic wave resonators and relates to a radio-frequency front end circuit and a communication device.

2. Description of the Related Art

In recent years, multiplexers that separate (split) a radio-frequency signal into multiple frequency bands have been widely used in communication devices such as mobile phone terminals in order to allow a plurality of frequency bands and a plurality of wireless methods (i.e., multiple bands and multiple modes) to be handled using a single terminal. A filter used in such a multiplexer is formed using acoustic wave resonators, for example.

As an example of an acoustic wave resonator, an acoustic wave device that is formed by stacking a high-acoustic-velocity film, a low-acoustic-velocity film, a piezoelectric film, and an IDT electrode in this order on a support substrate has been proposed (for example, refer to International Publication WO 2012/086639). The acoustic wave device has high efficiency at confining acoustic wave energy in the thickness direction of a multilayer substrate, can handle higher frequencies, and can realize a high Q value, and is therefore suitable for forming a filter that is small in size and has small transmission loss.

In a filter using acoustic wave resonators, it is known that a stop band (a region in which the wavelength of acoustic waves is constant due to the acoustic waves being confined by a grating) response is generated outside the pass band of the filter. In particular, a comparatively large stop band response is likely to be generated in a filter that uses acoustic wave resonators having a high acoustic wave energy confinement efficiency such as the acoustic wave resonator having the multilayer structure disclosed in International Publication WO 2012/086639.

Although this stop band response is not problematic in terms of the characteristics within the pass band of the filter itself, in a multiplexer in which paths that pass through a plurality of filters are connected together, the stop band response may affect the characteristics of another filter and cause degradation of the characteristics of the other filter. Specifically, when the frequency at which the stop band response is generated is located inside the pass band of the other filter, the stop band response causes an increase in a ripple inside the pass band of the other filter (pass band ripple).

SUMMARY OF THE INVENTION

Preferred embodiments of the present invention provide multiplexers that are each able to reduce or prevent a response at an upper end of a stop band of a filter, and further provide radio-frequency front end circuits and a communication devices.

A preferred embodiment of the present invention provides a multiplexer including a common terminal, a first terminal, and a second terminal, a first filter that is on a first path connected between the common terminal and the first terminal and that includes a plurality of acoustic wave resonators, and a second filter that is on a second path connected between the common terminal and the second terminal and that has a pass band located at a higher frequency than a pass band of the first filter. The plurality of acoustic wave resonators includes two or more series resonators on the first path and one or more parallel resonators on paths connected between nodes on the first path and ground. A first series resonator that is closest to the common terminal among the two or more series resonators is connected to the common terminal without any of the parallel resonators interposed therebetween. The plurality of acoustic wave resonators each include a substrate that exhibits piezoelectricity, an InterDigital Transducer (IDT) electrode including of a pair of comb-shaped electrodes on the substrate, and reflectors each including one or more reflection electrode fingers. A total number of reflection electrode fingers of at least one of the first series resonator and a first parallel resonator that is closest to the common terminal among the one or more parallel resonators is smaller than a total number of reflection electrode fingers of each of a remainder of the plurality of acoustic wave resonators.

A preferred embodiment of the present invention provides a multiplexer that includes a common terminal, a first terminal, and a second terminal, a first filter that is on a first path connected between the common terminal and the first terminal and includes a plurality of acoustic wave resonators, and a second filter that is on a second path connected between the common terminal and the second terminal and that has a pass band located at a higher frequency than a pass band of the first filter. The plurality of acoustic wave resonators includes one or more series resonators on the first path and two or more parallel resonators on paths connected between the first path and ground. The two or more parallel resonators include a first parallel resonator that is located on a side where the common terminal is provided and a parallel resonator that is located on a side where the first terminal is provided as seen from a first series resonator that is closest to the common terminal among the one or more series resonators. The plurality of acoustic wave resonators each include a substrate exhibiting piezoelectricity, an InterDigital Transducer (IDT) electrode including a pair of comb-shaped electrodes on the substrate, and reflectors each including one or more reflection electrode fingers. A total number of reflection electrode fingers of at least one of the first parallel resonator and the first series resonator is smaller than a total number of reflection electrode fingers of each of a remainder of the plurality of the acoustic wave resonators.

The stop band response of at least one of the first series resonator and the first parallel resonator, which greatly affect the second filter, is able to be reduced or prevented by making a total number of reflection electrode fingers of at least one of the first series resonator and the first parallel resonator smaller than a total number of reflection electrode fingers of each of the remainder of the plurality of acoustic wave resonators in this way. Thus, a response generated in the stop band of the first filter can be effectively reduced or prevented and the insertion loss in the pass band of the second filter can be reduced.

With the multiplexers and so forth according to a preferred embodiment of the present invention, a response generated in a stop band of a filter is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Background to Present Invention

Figure 1:
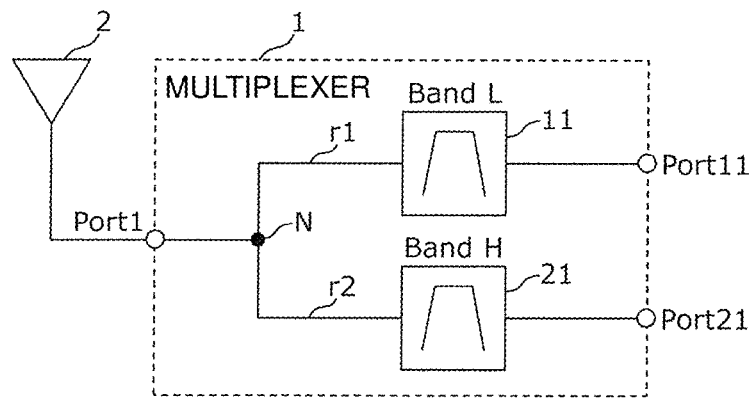
FIG. 1 is a basic configuration diagram of a multiplexer that is used in both a preferred embodiment of the present invention and a comparative example.

First, advantageous effects of preferred embodiments of the present invention will be described while referring to FIGS. 1 to 4. FIG. 1 is a basic configuration diagram of a multiplexer that is used in both preferred embodiments of the present invention and a comparative example. In the diagram, an antenna element 2 that is connected to a common terminal Port 1 is also illustrated.

The multiplexer 1 includes the common terminal Port 1, a first terminal Port 11, a second terminal Port 21, a first filter 11, and a second filter 21. The first filter 11 is on a first path r1 connected between the common terminal Port 1 and the first terminal Port 11. The second terminal Port 21 is on a second path r2 connected between the common terminal Port 1 and the second terminal Port 21. The second filter 21 is configured so that a frequency pass band thereof is higher than a frequency pass band of the first filter 11.

Figure 2:
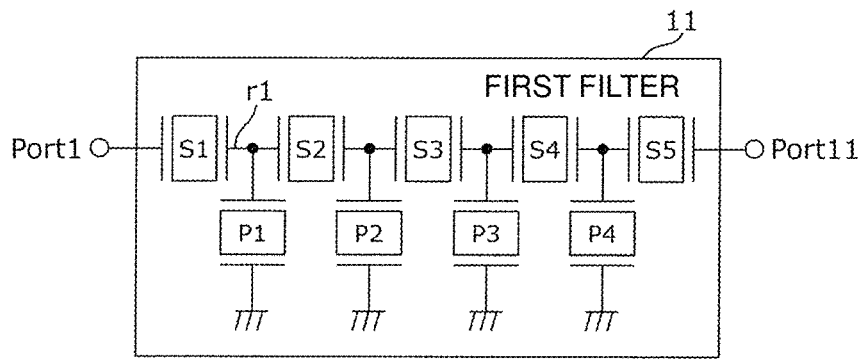
FIG. 2 is a circuit configuration diagram illustrating a first filter of a multiplexer according to a comparative example.

FIG. 2 is a circuit configuration diagram illustrating a first filter 11 of a multiplexer 1 according to a comparative example.

The first filter 11 according to the comparative example is a ladder filter that includes a plurality of acoustic wave resonators. The first filter 11 includes series resonators S1, S2, S3, S4, and S5, which are acoustic wave resonators on the first path r1, and parallel resonators P1, P2, P3, and P4, which are acoustic wave resonators on paths connected between the first path r1 and ground. The series resonators S1 to S5 are arranged in this order from the common terminal Port 1 to the first terminal Port 11. The parallel resonator P1 is connected between the series resonators S1 and S2, the parallel resonator P2 is connected between the series resonators S2 and S3, the parallel resonator P3 is connected between the series resonators S3 and S4, and the parallel resonator P4 is connected between the series resonators S4 and S5. Hereafter, all or some of the series resonators S1 to S5 and the parallel resonators P1 to P4 may be referred to as "resonators".

Figure 3:
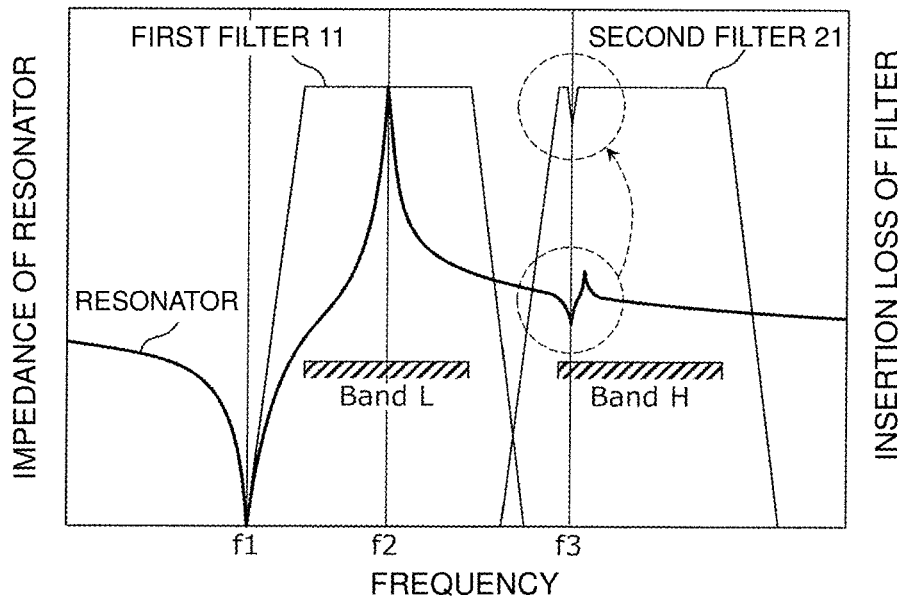
FIG. 3 is a schematic diagram illustrating a response generated in a stop band of the first filter according to the comparative example.

A problem that may occur in the multiplexer 1 according to the comparative example will be described while referring to FIG. 3. FIG. 3 is a schematic diagram illustrating a response generated in a stop band of the first filter 11 according to the comparative example. The thick line in the graph in FIG. 3 represents the impedance characteristic of the series resonator S1, which has a resonant frequency f1 and an anti-resonant frequency f2, and the thin line in the graph in FIG. 3 represents the insertion loss of the first filter 11 and the insertion loss of the second filter 21.

The stop band response is a spurious component generated by the reflectors of the resonator and for example appears as a ripple-shaped disturbance in the impedance at a frequency higher than the anti-resonant point of the resonator. As illustrated in FIG. 3, when a stop band response caused by any resonator of the first filter 11 is generated at a frequency f3 inside the pass band of the second filter 21, a portion of the signal at the frequency f3 that should have been reflected by the first filter 11 is lost without being reflected and a ripple is generated in the pass band of the second filter 21. In order to reduce the ripple in the second filter 21, it is necessary to reduce or prevent the stop band response generated by a resonator of the first filter 11.

As described above, in a filter that includes acoustic wave resonators, a stop band response is generated outside the pass band of the filter. In particular, although a filter that is small in size and has a small transmission loss can be made when using an acoustic wave resonator that has a high acoustic wave energy confinement efficiency, it is likely that a comparatively large stop band response will be generated. Accordingly, a technique is needed to reduce or prevent the stop band response.

Next, description will be provided regarding which resonators among the plurality of resonators included in the first filter 11 have stop band responses that have the greatest effects on the second filter 21, i.e., description will be provided regarding which resonators should have their stop band responses reduced or prevented in order to effectively reduce the insertion loss of the second filter 21.

Figure 4:
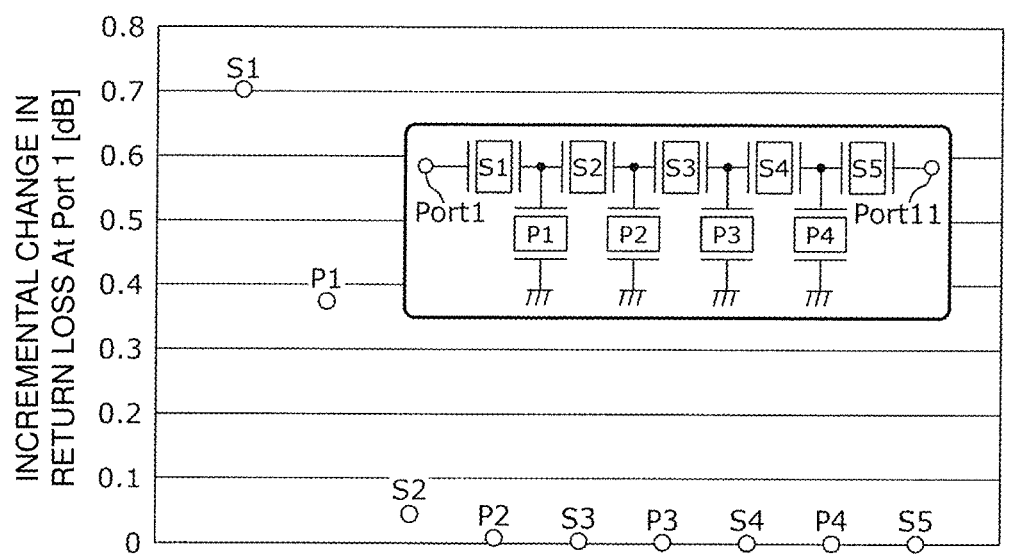
FIG. 4 is a diagram for explaining return loss of the first filter of the comparative example.

FIG. 4 is a diagram for explaining the return loss of the first filter 11 of the comparative example. FIG. 4 is a diagram illustrating the incremental changes in return loss that occur when a resistance is inserted into one of the plurality of resonators of the first filter 11 and a signal of a prescribed frequency is input compared with the return loss in a case where the signal of the prescribed frequency is input to the first filter 11 from the common terminal Port 1. The signal of a prescribed frequency that is input to the first filter 11 is a signal that lies inside the stop band of the first filter 11 and includes a frequency in the pass band of the second filter 21.

Insertion of a resistance into a resonator simulates a state where a stop band response is generated in that resonator. The return loss of the first filter 11 increases by differing degrees depending on the resonator into which the resistance is inserted, i.e., depending on the resonator in which the stop band response is generated.

Here, "return loss" refers to the reflection loss of the first filter 11 as seen from the common terminal Port 1, and reflection of the signal from the first filter 11 becomes smaller as return loss increases. That is, a signal having a frequency in the pass band of the second filter 21 is absorbed by the first filter 11 and therefore insertion loss in the second filter 21 is increased.

As illustrated in FIG. 4, the incremental change in return loss that occurs when the resistance is inserted into the series resonator S1, which is closest to the common terminal Port 1, is about 0.7 dB at maximum and the incremental change in return loss that occurs when the resistance is inserted into the parallel resonator P1, which is second closest to the common terminal Port 1, is about 0.38 dB at maximum. On the other hand, the incremental change in return loss that occurs when the resistance is inserted into the series resonator S2, which is third closest to the common terminal Port 1, is about 0.05 dB at maximum and the incremental changes in return loss that occur when the resistor is inserted into the resonators P2 to P4 and S3 to S5, which are fourth closest and so on to the common terminal Port 1, are around 0 dB and the return loss in these cases can be regarded as having almost not increased at all.

Thus, the increase in return loss in the first filter 11 is largest when the stop band response is generated in resonators located close to the common terminal Port 1, more specifically, the series resonator and the parallel resonator in the first stage next to the common terminal Port 1. Therefore, the inventors of preferred embodiments of the present invention have discovered that an effective countermeasure for reducing the insertion loss of the second filter 21 is to reduce or prevent the stop band responses in the series resonator and the parallel resonator in the first stage next to the common terminal Port 1.

In the multiplexer 1 according to a preferred embodiment of the present invention, the resonators that are located near the common terminal Port 1 have a structure that reduces or prevents the stop band response. As a result, the insertion loss in the pass band of the second filter 21 can be reduced.

Hereafter, preferred embodiments of the present invention will be described in detail using examples and the drawings. The preferred embodiments described hereafter each illustrate a comprehensive or specific example of the present invention. The numerical values, shapes, materials, elements, arrangements of the elements, the ways in which the elements are connected, and so forth described in the following preferred embodiments are merely examples and are not intended to limit the present invention. Furthermore, in the drawings, portions of configurations that are the same or substantially the same as each other are denoted by the same symbols and repeated description thereof may be omitted or simplified. In addition, in the following preferred embodiments, "is connected" is not limited to meaning directly connected and also includes the case of being electrically connected via another element or the like.

Preferred Embodiment 1

A multiplexer 1 according to preferred embodiment 1 of the present invention will be described with reference to FIGS. 1 and 5 to 9. Although there is some overlap between elements included in preferred embodiment 1 and the above-described comparative example, such overlapping elements will be described again in preferred embodiment 1.

1-1. Configuration of Multiplexer

The multiplexer 1 of preferred embodiment 1 is preferably a multiplexer (splitter) that includes a plurality of filters that have different pass bands from each other and the antenna-side terminals of the plurality of filters are connected together at the common terminal Port 1. Specifically, as illustrated in FIG. 1, the multiplexer 1 preferably includes a common terminal Port 1, a first terminal Port 11, a second terminal Port 21, a first filter 11, and a second filter 21.

The common terminal Port 1 is commonly provided for both the first filter 11 and the second filter 21 and is connected to the first filter 11 and the second filter 21 inside the multiplexer 1. Furthermore, the common terminal Port 1 is connected to an antenna element 2 outside the multiplexer 1. That is, the common terminal Port 1 is an antenna terminal of the multiplexer 1.

The first terminal Port 11 is connected to the first filter 11 inside the multiplexer 1. The second terminal Port 21 is connected to the second filter 21 inside the multiplexer 1. In addition, the first terminal Port 11 and the second terminal Port 21 are connected to a radio-frequency integrated circuit (RFIC) (not illustrated) via an amplification circuit and so forth (not illustrated) outside the multiplexer 1.

The first filter 11 is on a first path r1 connected between the common terminal Port 1 and the first terminal Port 11. The first filter 11 is preferably, for example, a reception filter that uses a downlink frequency band (reception band) in a low band (Band L) as a pass band.

The second filter 21 is on a second path r2 connected between the common terminal Port 1 and the second terminal Port 21. The second filter 21 is preferably, for example, a reception filter that uses a downlink frequency band (reception band) in a high band (Band H) as a pass band.

As the characteristics of the first filter 11 and the second filter 21, it is required that the first filter 11 and the second filter 21 have characteristics so that the reception band of the corresponding Band (or reception band) is allowed to pass therethrough and the other bands are attenuated. In this preferred embodiment, the second filter 21 is configured so that the frequency of the pass band thereof is higher than that of the first filter 11.

The first path r1 and the second path r2 are connected to each other at a node N. That is, the node N is the point at which the first path r1 and the second path r2 are connected to each other. In the multiplexer 1, an impedance element such as an inductor for impedance matching may be connected along the first path r1 connected between the first filter 11 and the node N and along the second path r2 connected between the second filter 21 and the node N, or along the path connected between the node N and the common terminal Port 1, and so on.

1-2. Configuration of Filter

Next, the preferred configurations of the first filter 11 and the second filter 21 will be described by using the first filter 11 having Band L as a pass band as an example.

Figure 5:
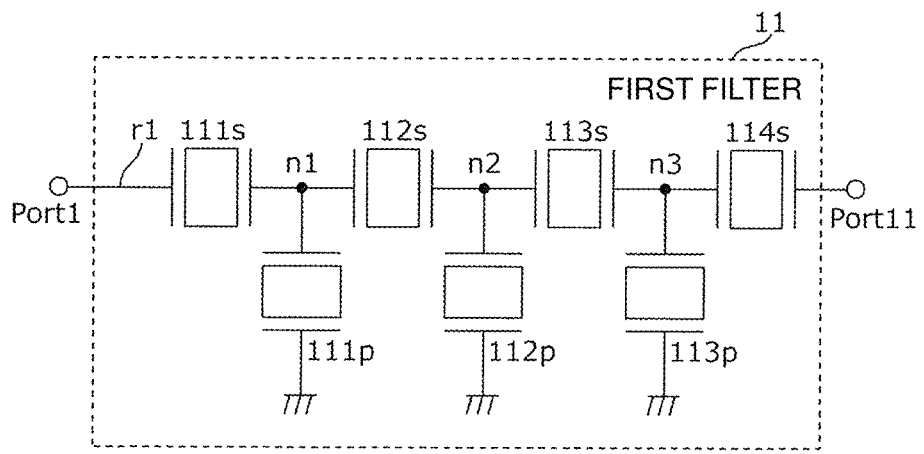
FIG. 5 is a circuit configuration diagram illustrating a first filter of a multiplexer according to preferred embodiment 1 of the present invention.

FIG. 5 is a circuit configuration diagram depicting the first filter 11. As illustrated in this figure, the first filter 11 preferably includes series resonators 111s, 112s, 113s, and 114s and parallel resonators 111p, 112p, and 113p, which are acoustic wave resonators. Hereafter, all or some of the series resonators 111s to 114s and the parallel resonators 111p to 113p may be referred to as "resonators 110".

The series resonators 111s to 114s are connected in series with each other in this order from the side where the common terminal Port 1 is provided on the first path (series arm) r1 connected between the common terminal Port 1 and the first terminal Port 11. Furthermore, the parallel resonator 111p to 113p are preferably connected in parallel with each other on paths (parallel arms) connected between nodes n1, n2, and n3, which are located between the adjacent series resonators 111s to 114s on the first path r1, and reference terminals (ground). Specifically, the series resonator 111s, which is closest to the common terminal Port 1, is connected to the common terminal Port 1 without any of the parallel resonators 111p to 113p interposed therebetween. First ends of the parallel resonators 111p to 113p are each connected to one of the nodes n1, n2, and n3 and second ends thereof are connected to the reference terminals.

Thus, the first filter 11 preferably has a T-type ladder filter structure, for example, including of two or more series resonators on the first path r1 (four series resonators in this preferred embodiment) and one or more parallel resonators on paths connected between the first path r1 and reference terminals (three parallel resonators in this preferred embodiment).

The total numbers of series resonators and parallel resonators of the first filter 11 are not limited to being respectively four and three, and it is sufficient that there is two or more series resonators and one or more parallel resonators. In addition, the parallel resonators may be connected to the reference terminals via inductors. In addition, an impedance element such as an inductor and a capacitor may be inserted along or connected to the series arm or the parallel arms. Furthermore, although the reference terminals to which the parallel resonators are connected are provided in an individual manner in FIG. 5, whether or not the reference terminals are provided in an individual manner or a shared manner can be appropriately selected in accordance with, for example, constraints on the mounting layout of the first filter 11 and so on.

1-3. Structure of Acoustic Wave Resonator

Next, the basic structure of the resonators 110 of the first filter 11 will be described. The resonators 110 of this preferred embodiment are preferably surface acoustic wave (SAW) resonators.

The second filter 21, which is the other filter, is not limited to the above structure and may be configured as appropriate in accordance with the required filter characteristics and so forth. Specifically, the second filter 21 does not need to have a ladder filter structure and, for example, may instead have a longitudinally-coupled filter structure. Furthermore, the resonators defining the second filter 21 are not limited to being SAW resonators and, for example, may instead be bulk acoustic wave (BAW) resonators. In addition, the second filter 21 may be made without using resonators and for example may instead be an LC resonance filter or a dielectric filter.

Figure 6:
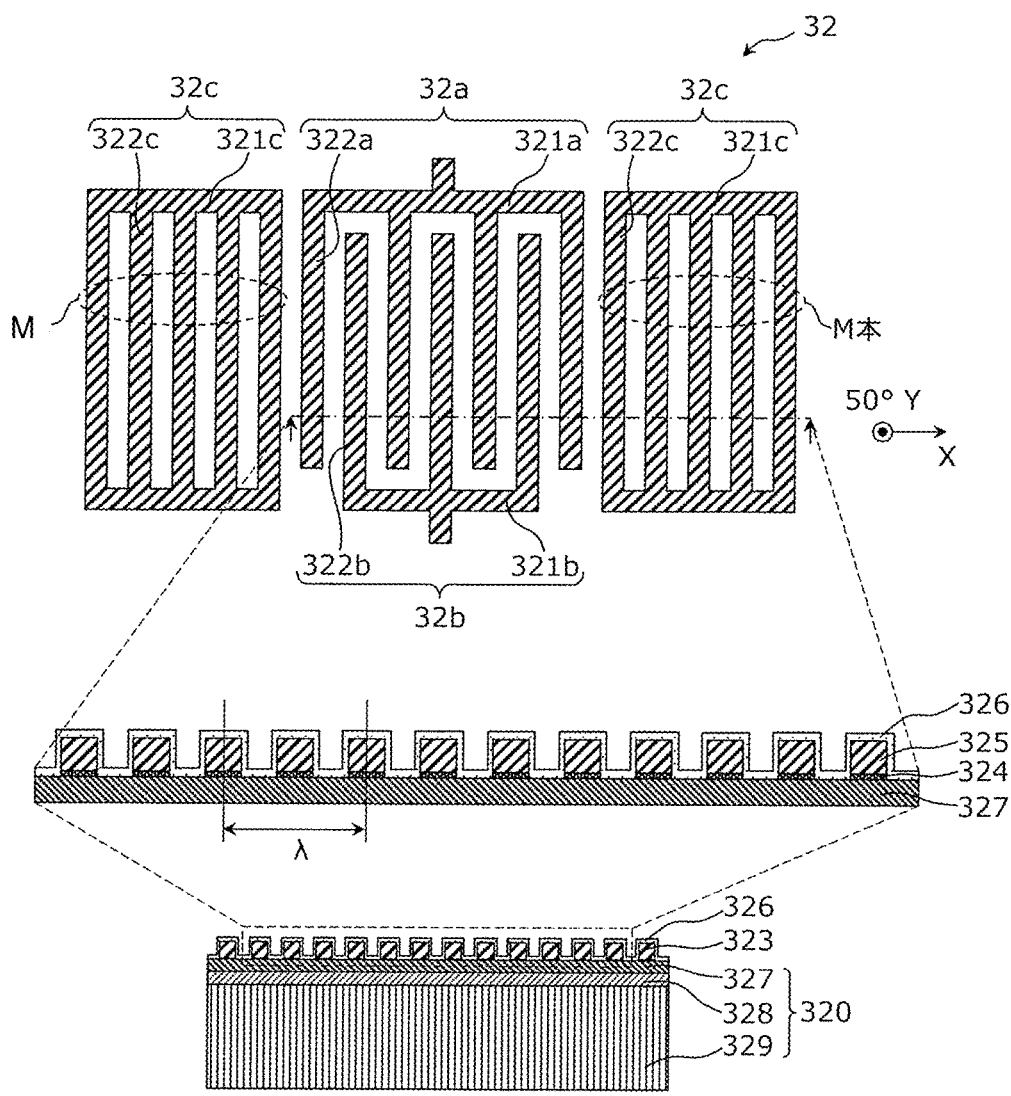
FIG. 6 depicts a plan view and a sectional view that schematically illustrate an acoustic wave resonator of the first filter according to preferred embodiment 1 of the present invention.

FIG. 6 depicts a plan view and a sectional view that schematically illustrate the resonator 110 of the first filter 11. The resonator 110 illustrated in FIG. 6 is for the purpose of explaining the typical structure of the resonators 110, and the total number, length, and so forth of the electrode fingers defining the electrodes are not limited to those illustrated in this example.

As illustrated in the plan view in FIG. 6, the resonator 110 preferably includes a pair of comb-shaped electrodes 32a and 32b that oppose each other and reflectors 32c that are arranged in an acoustic wave propagation direction X with respect to the pair of comb-shaped electrodes 32a and 32b. The pair of comb-shaped electrodes 32a and 32b define an IDT electrode 32.

The comb-shaped electrode 32a includes a plurality of electrode fingers 322a that are arranged like the teeth of a comb and are parallel or substantially parallel to each other and a busbar electrode 321a that connects the ends of the plurality of electrode fingers 322a to each other. In addition, the comb-shaped electrode 32b includes a plurality of electrode fingers 322b that are arranged like the teeth of a comb and are parallel or substantially parallel to each other and a busbar electrode 321b that connects the ends of the plurality of electrode fingers 322b to each other. The plurality of electrode fingers 322a and 322b are provided so as to extend in a direction perpendicular or substantially perpendicular to the acoustic wave propagation direction X.

A pair of reflectors 32c are arranged in the acoustic wave propagation direction X with respect to the pair of comb-shaped electrodes 32a and 32b. Specifically, the pair of reflectors 32c are arranged such that the pair of comb-shaped electrodes 32a and 32b are interposed therebetween in the acoustic wave propagation direction X. Each reflector 32c includes M reflection electrode fingers 322c that are parallel or substantially parallel to each other and reflector busbar electrodes 321c that connect the plurality of reflection electrode fingers to each other. The pair of reflectors 32c are provided such that the reflector busbar electrodes 321c extend along the acoustic wave propagation direction X.

1-4. Cross-sectional Structure of Acoustic Wave Resonator

Next, the cross-sectional structure of the resonator 110 will be described while again referring to FIG. 6.

As illustrated in the sectional view of FIG. 6, the IDT electrode 32, which includes the plurality of electrode fingers 322a and 322b and the busbar electrodes 321a and 321b, has a multilayer structure including an adhesive layer 324 and a main electrode layer 325. In addition, the cross-sectional structure of the reflectors 32c is preferably the same or substantially the same as that of the IDT electrode 32, and therefore description thereof will be omitted below.

The adhesive layer 324 improves the adhesion between a piezoelectric layer 327 and the main electrode layer 325, and, for example, Ti is preferably used as the material thereof. The film thickness of the adhesive layer 324 is preferably about 12 nm, for example.

For example, Al containing 1% Cu is preferably used as the material of the main electrode layer 325. The film thickness of the main electrode layer 325 is preferably about 162 nm, for example.

A protective layer 326 covers the IDT electrode 32. The purpose of the protective layer 326 is to protect the main electrode layer 325 from the outside environment, adjust the frequency-temperature characteristic, increase moisture resistance, and so forth, and for example, is preferably a film having silicon dioxide as a main component. The film thickness of the protective layer 326 is preferably 25 nm, for example.

The IDT electrode 32 and the reflectors 32c are provided on a main surface of a substrate 320, which will be described next. Hereafter, the multilayer structure of the substrate 320 in this preferred embodiment will be described.

As illustrated in the lower portion of FIG. 6, the substrate 320 includes a structure that includes a high-acoustic-velocity support substrate 329, a low-acoustic-velocity film 328, and the piezoelectric layer 327 and in which the high-acoustic-velocity support substrate 329, the low-acoustic-velocity film 328, and the piezoelectric layer 327 are stacked on top of one another in this order.

The piezoelectric layer 327 is a piezoelectric film with the IDT electrode 32 and the reflectors 32c provided on a main surface thereof. For example, the piezoelectric layer 327 is preferably made of a 50° Y cut X propagation $LiTaO_3$ piezoelectric single crystal or a piezoelectric ceramic (lithium tantalate single crystal cut along plane having a normal line that is an axis rotated about 50° from a Y axis around an X axis or a ceramic, surface acoustic waves propagating in the X axis direction in the single crystal or ceramic). The thickness of the piezoelectric layer 327 is preferably less than or equal to about $3.5\lambda$ where $\lambda$ is the wavelength of an acoustic wave determined by the electrode pitch of the IDT electrode 32, and is preferably, for example, about 600 nm.

The high-acoustic-velocity support substrate 329 is a substrate that supports the low-acoustic-velocity film 328, the piezoelectric layer 327, and the IDT electrode 32. The high-acoustic-velocity support substrate 329 is a substrate in which the acoustic velocity of a bulk wave inside the high-acoustic-velocity support substrate 329 is higher than that of a surface acoustic wave or a boundary acoustic wave propagating along the piezoelectric layer 327 and the high-acoustic-velocity support substrate 329 functions so that a surface acoustic wave is confined to the portion of the substrate where the piezoelectric layer 327 and the low-acoustic-velocity film 328 are stacked and does not leak into the region below the high-acoustic-velocity support substrate 329. The high-acoustic-velocity support substrate 329 is preferably, for example, a silicon substrate and has a thickness of 125 μm, for example.

The low-acoustic-velocity film 328 is a film in which the acoustic velocity of a bulk wave inside the low-acoustic-velocity film 328 is lower than the acoustic velocity of a bulk wave propagating along the piezoelectric layer 327, and is arranged between the piezoelectric layer 327 and the high-acoustic-velocity support substrate 329. Leaking of surface acoustic wave energy to outside the IDT electrode 32 is reduced or prevented by this structure and by the property that the energy of an acoustic wave is naturally concentrated in a low-acoustic-velocity medium. The low-acoustic-velocity film 328 is preferably, for example, a film having silicon dioxide as a main component. The thickness of the low-acoustic-velocity film 328 is preferably less than or equal to about $2\lambda$ where $\lambda$ is the wavelength of an acoustic wave determined by the electrode pitch of the IDT electrode 32, and is preferably, for example, about 670 nm.

According to the above-described multilayer structure of the substrate 320 in this preferred embodiment, the Q values at the resonant frequency and the anti-resonant frequency can be greatly increased compared with, for example, a structure of the related art in which a piezoelectric substrate is used as a single layer. However, according to the multilayer structure, the acoustic wave energy confinement efficiency in the thickness direction of the substrate 320 is high, and therefore the stop band response generated by the resonator 110 is unlikely to be attenuated and will remain. Therefore, in the resonator 110 of this preferred embodiment having the above-described multilayer structure, a countermeasure to reduce or prevent the stop band response is even more necessary.

Accordingly, in this preferred embodiment, at least one of the reflectors of the series resonator 111s that is closest to the common terminal Port 1 and the reflectors of the parallel resonator 111p that is closest to the common terminal Port 1 includes a smaller number of reflection electrode fingers 322c than in the remaining resonators 112s to 114s, 112p, and 113p.

1-5. Advantageous Effects Etc.

Figure 7:
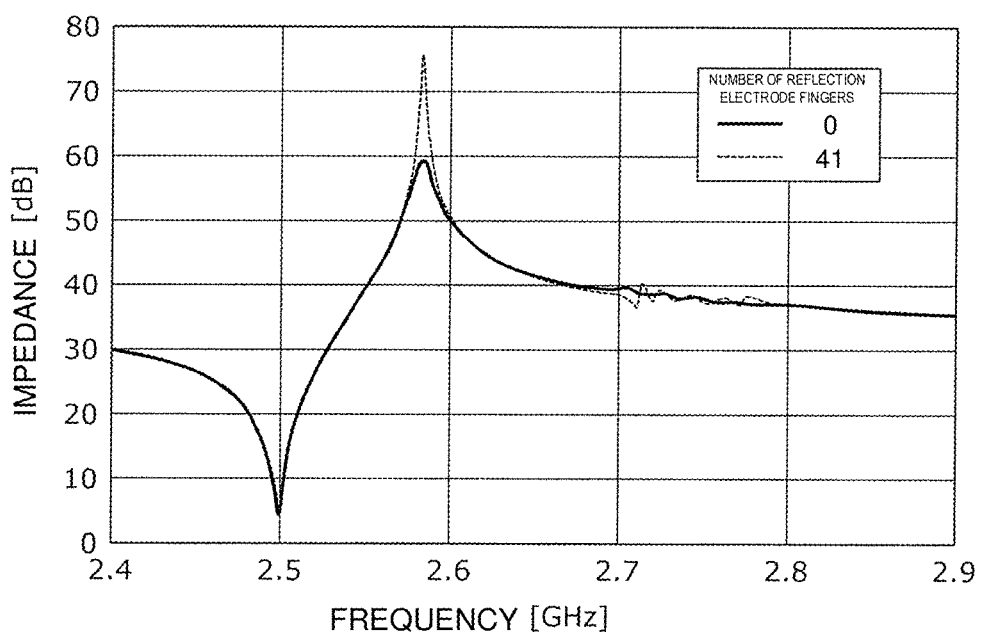
FIG. 7 is a diagram illustrating the relationship between the total number of reflection electrode fingers of an acoustic wave resonator and impedance.

FIG. 7 is a diagram that compares the impedances of resonators 110 resulting from differences in the total number of reflection electrode fingers 322c defining each reflector 32c. Specifically, FIG. 7 is a diagram illustrating the relationship between frequency and impedance for cases where the total number of reflection electrode fingers defining each reflector 32c is 0 and 41. Here, "the total number of reflection electrode fingers is 0" means that the resonator 110 does not include the reflectors 32c.

As illustrated in FIG. 7, in the resonator 110 in which the number of the reflection electrode fingers is 41, disturbance of the impedance in the stop band of the first filter 11 is comparatively large and a clear stop band response appears at a frequency of around 2700 MHz, which is in the pass band of the second filter 21.

In contrast, in the resonator 110 in which the total number of the reflection electrode fingers is 0 (no reflectors 32c), the disturbance of the impedance in the stop band of the first filter 11 is small and the stop band response negligibly appears in the pass band of the second filter 21.

Figure 8A:
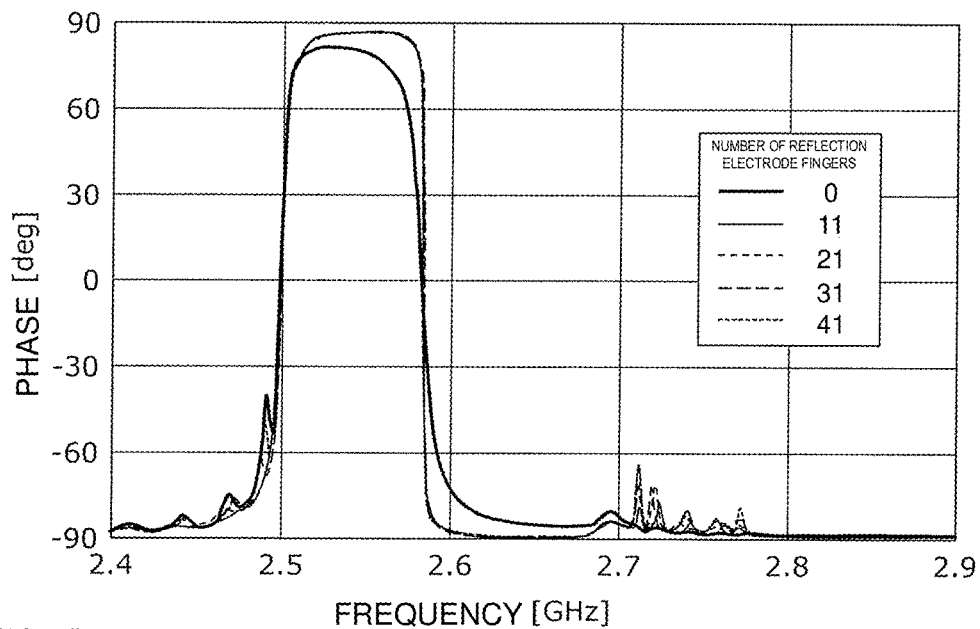
FIG. 8A is a diagram illustrating the relationship between the total number of reflection electrode fingers of an acoustic wave resonator and phase.

FIG. 8A is a diagram illustrating the relationship between frequency and phase for the resonator 110, the phases having been obtained by converting the impedances illustrated in FIG. 7 using the S parameter. FIG. 8A illustrates phases obtained by converting impedances for when the total numbers of reflection electrode fingers are 0 and 41 and impedances for when the total numbers of reflection electrode fingers are 11, 21, and 31 (not illustrated in FIG. 7). When impedances are converted into phases in this way, the differences in the stop band response that occur when the total number of reflection electrode fingers is changed markedly appear as differences in phase.

As illustrated in FIG. 8A, in the resonator 110, the phase increases in the stop band of the first filter 11 and a stop band response appears. Looking at the phase for each number of reflection electrode fingers, the phase is large when the total number of reflection electrode fingers is 41 and the phase then decreases as the total number of reflection electrode fingers decreases step by step. For example, when the total number of reflection electrode fingers is 11, the phase in the stop band of the first filter 11 is small and the stop band response almost disappears.

Figure 8B:
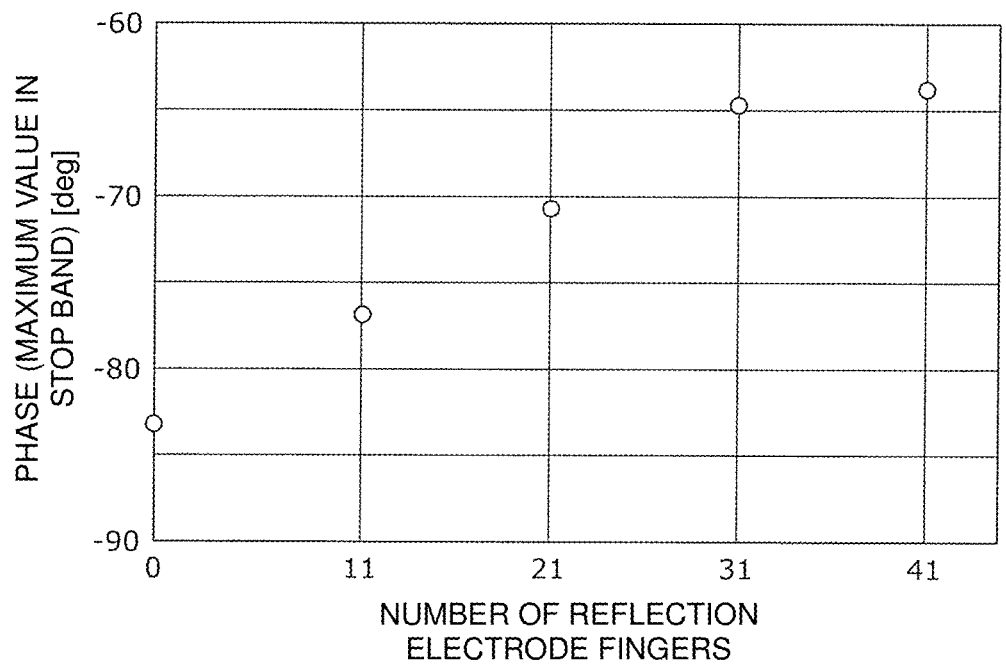
FIG. 8B is a diagram illustrating the relationship between the total number of reflection electrode fingers of an acoustic wave resonator and phase.

FIG. 8B is a diagram illustrating the relationship between the total number of reflection electrode fingers of the resonator 110 and the maximum value of the phase in the stop band of the first filter 11. Specifically, FIG. 8B is a diagram in which the maximum value of the phase in the stop band is plotted for each number of reflection electrode fingers in a graph in which the horizontal axis represents the total number of reflection electrode fingers of the resonator 110 illustrated in FIG. 8A and the vertical axis represents the phase.

As illustrated in FIG. 8B, in the resonator 110, the phase is large when the total number of reflection electrode fingers is 41 and the phase then decreases as the total number of reflection electrode fingers decreases.

As illustrated in FIGS. 8A and 8B, the disturbance in the impedance and the phase can be made small and generation of the stop band response can be reduced or prevented by making the total number of reflection electrode fingers of the resonator 110 less than or equal to 11.

Figure 9A:
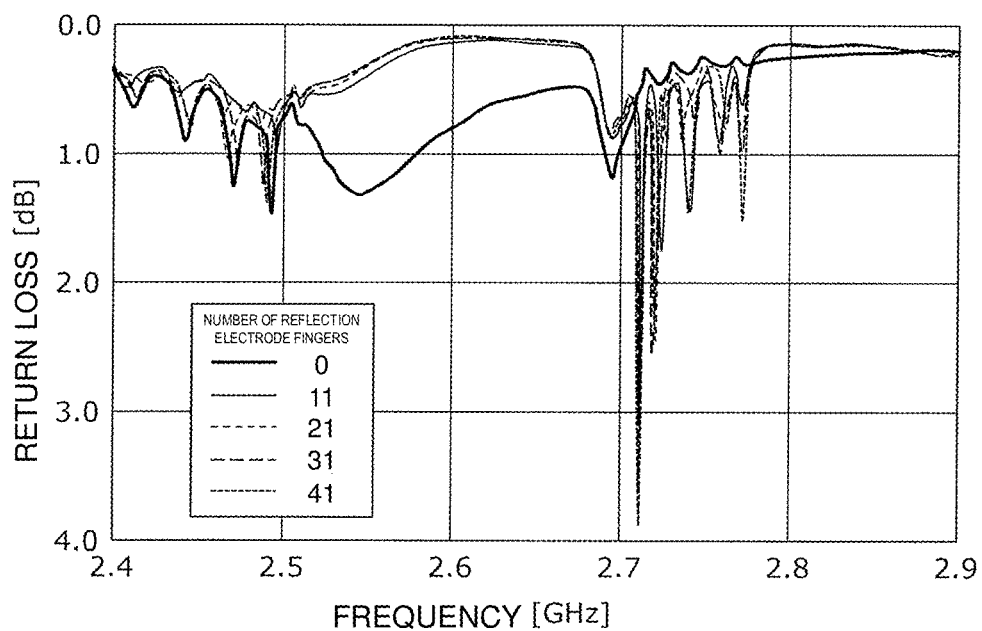
FIG. 9A is a diagram illustrating the relationship between the total number of reflection electrode fingers of an acoustic wave resonator and return loss.
Figure 11:
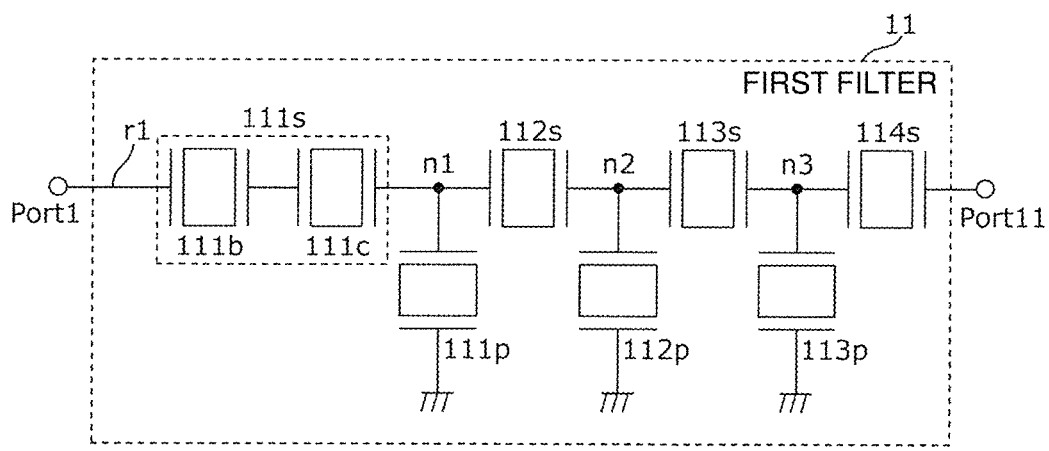
FIG. 11 is a circuit configuration diagram of a first filter according to modification 2 of preferred embodiment 1 of the present invention.

FIG. 9A is a diagram illustrating the return loss of the first filter 11. Specifically, the FIG. 11 is a diagram illustrating the relationship between the frequency and the return loss of the first filter 11 when the total number of reflection electrode fingers of the series resonator 111s is changed. The return loss is the ratio between the strength of a signal input to the first filter 11 from the common terminal Port 1 and the strength of a signal output to the common terminal Port 1. This means that as the return loss increases, reflection of a signal decreases and the insertion loss of the second filter 21 increases. The total number of reflection electrode fingers of each of the series resonators 112s to 114s and the parallel resonators 111p to 113p is fixed regardless of the total number of reflection electrode fingers of the series resonator 111s.

As illustrated in FIG. 9A, in the first filter 11, return loss increases in the vicinity of a frequency of about 2700 MHz, which is in the stop band. Looking at the return loss for each number of reflection electrode fingers, the return loss is large when the total number of reflection electrode fingers is 41 and the return loss then decreases as the total number of reflection electrode fingers decreases step by step. For example, when the total number of reflection electrode fingers is 11, the return loss almost disappears in the vicinity of the frequency of about 2700 MHz, which in the stop band of the first filter 11.

Figure 9B:
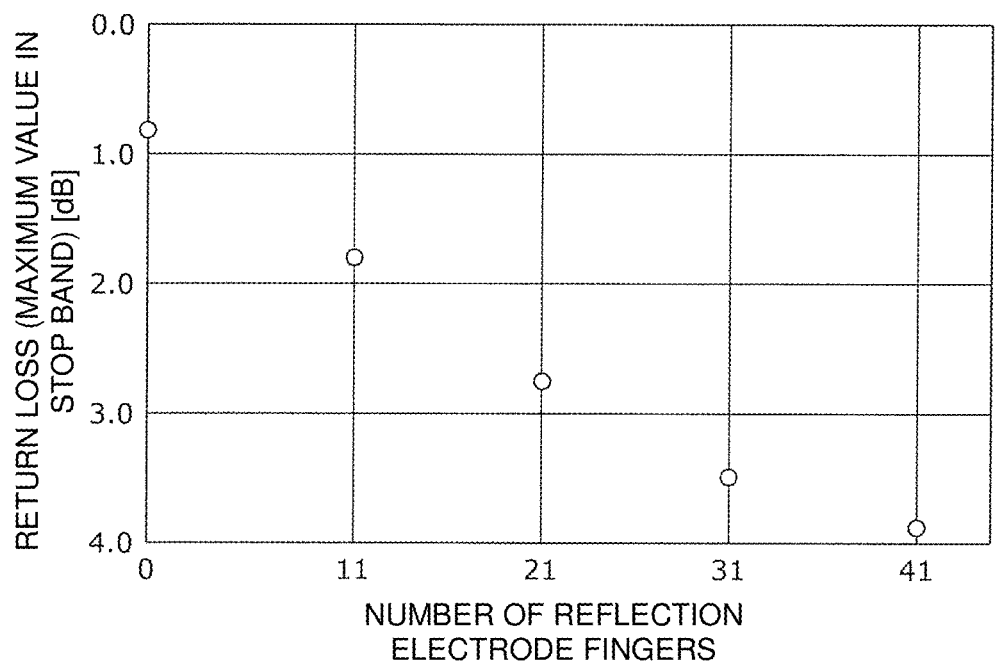
FIG. 9B is a diagram illustrating the relationship between the total number of reflection electrode fingers of an acoustic wave resonator and return loss.

FIG. 9B is a diagram illustrating the relationship between the total number of reflection electrode fingers of the series resonator 111s and the maximum value of the return loss in the stop band of the first filter 11. Specifically, FIG. 9B is a diagram in which the maximum value of the return loss in the stop band is plotted for each number of reflection electrode fingers in a graph in which the horizontal axis represents the total number of reflection electrode fingers of the series resonator 111s illustrated in FIG. 9A and the vertical axis represents the return loss.

As illustrated in FIG. 9B, in the first filter 11, the return loss is large when the total number of reflection electrode fingers of the series resonator 110 is 41 and the return loss then decreases as the total number of reflection electrode fingers decreases.

As illustrated in FIGS. 9A and 9B, under the condition that the total number of reflection electrode fingers of each of the series resonators 112s to 114s and the parallel resonators 111p to 113p is constant, the return loss of the first filter 11 can be reduced by making the total number of reflection electrode fingers of the series resonator 111s of the first filter 11 less than or equal to 11.

Therefore, it has been discovered that the stop band response can be reduced by using a resonator 110 including a smaller number of reflection electrode fingers compared with a case where a resonator 110 is used that has a larger number of reflection electrode fingers. Therefore, the stop band response of the first filter 11 can be reduced and the insertion loss of the second filter 21 can be effectively reduced by making the total number of reflection electrode fingers of at least one of the series resonator 111s and the parallel resonator 111p smaller than the total number of reflection electrode fingers of each of the resonators 112s to 114s and 112p and 113p.

The multiplexer 1 according to this preferred embodiment includes the common terminal Port 1, the first terminal Port 11, and the second terminal Port 21, the first filter 11 on the first path r1 connected between the common terminal Port 1 and the first terminal Port 11, and the second filter 21 on the second path r2 connected between the common terminal Port 1 and the second terminal Port 21 and having a pass band located at a higher frequency than that of the first filter 11.

The first filter 11 includes two or more series resonators on the first path r1 (for example, the series resonators 111s to 114s) and one or more parallel resonators on paths connected between the nodes n1 to n3, which are located between the adjacent series resonators 111s to 114s on the first path r1, and ground (for example, the parallel resonators 111p to 113p). The series resonator 111s, which is closest to the common terminal Port 1 among the two or more series resonators 111s to 114s, is connected to the common terminal Port 1 without any of the parallel resonators 111p to 113p interposed therebetween.

Each resonator among the two or more series resonators 111s to 114s and the one or more parallel resonators 111p to 113p includes the IDT electrode 32 including the pair of comb-shaped electrodes 32a and 32b on the substrate 320 exhibiting piezoelectricity, and the reflectors 32c each including one or more reflection electrode fingers.

At least one of the total number of reflection electrode fingers of the series resonator 111s and the total number of reflection electrode fingers of the parallel resonator 111p is smaller than the total number of reflection electrode fingers of each of the resonators 112s to 114s, 112p, and 113p. Here, the series resonator 111s is an example of a first series resonator, the parallel resonator 111p is an example of a first parallel resonator, and the resonators 112s to 114s, 112p, and 113p are examples of the remainder of the plurality of acoustic wave resonators.

By making at least one of the total number of reflection electrode fingers of the series resonator 111s, which is closest to the common terminal Port 1, and the total number of reflection electrode fingers of the parallel resonator 111p, which is closest to the common terminal Port 1, smaller than the total number of reflection electrode fingers of each of the remaining resonators 112s to 114s, 112p, and 113p in this way, generation of the stop band response of at least one of the series resonator 111s and the parallel resonator 111p that greatly affect the second filter 21 can be reduced or prevented. Thus, the stop band response of the first filter 11 can be reduced or prevented and insertion loss in the pass band of the second filter 21 can be effectively reduced.

Modification 1 of Preferred Embodiment 1

In a multiplexer 1 according to modification 1 of preferred embodiment 1, the reflection electrode fingers of the series resonator 111s and the reflection electrode fingers of the parallel resonator 111p both include a smaller number of reflection electrode fingers than each of the remaining resonators 112s to 114s, 112p, and 113p.

Figure 10:
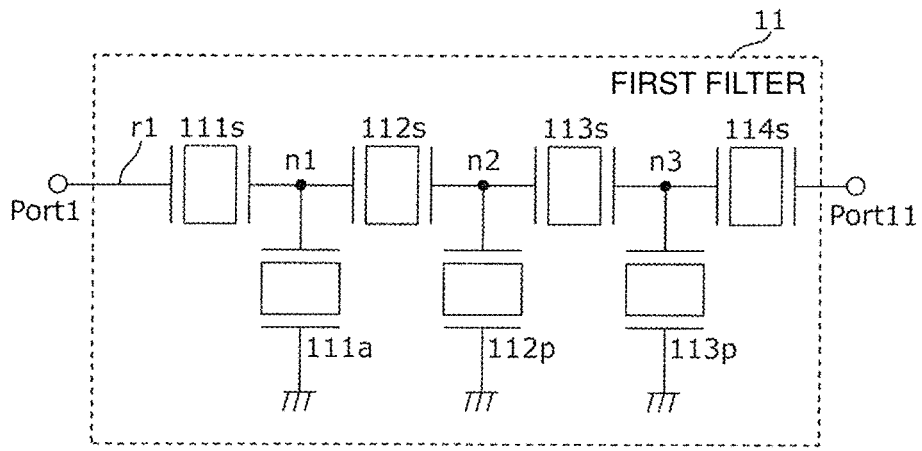
FIG. 10 is a circuit configuration diagram of a first filter according to modification 1 of preferred embodiment 1 of the present invention.

FIG. 10 is a circuit configuration diagram of a first filter 11 according to modification 1 of preferred embodiment 1. The first filter 11 according to modification 1 includes a parallel resonator 111a instead of the parallel resonator 111p illustrated in preferred embodiment 1. The parallel resonator 111a is an example of a first parallel resonator that is arranged at a position closest to the common terminal Port 1 among the plurality of parallel resonators 111a, 112p, and 113p.

In the first filter 11 of modification 1, both the total number of reflection electrode fingers of the series resonator 111s and the total number of reflection electrode fingers of the parallel resonator 111a are smaller than the total number of reflection electrode fingers of each of the remaining resonators 112s to 114s, 112p, and 113p. The total number of reflection electrode fingers of the series resonator 111s and the total number of reflection electrode fingers of the parallel resonator 111a may be the same as each other or may be different from each other.

A response in the stop band of the first filter 11 can be further reduced or prevented by using the above-described configuration for both the series resonator 111s and the parallel resonator 111a, which affect the second filter 21, among the series resonators 111s to 114s and the parallel resonators 111a, 112p, and 113p of the first filter 11.

Modification 2 of Preferred Embodiment 1

In a multiplexer 1 according to modification 2 of preferred embodiment 1, the series resonator 111s of the first filter 11 is defined by divided resonators.

FIG. 11 is a circuit configuration diagram of the first filter 11 according to modification 2 of preferred embodiment 1. As illustrated in FIG. 11, in the multiplexer 1 according to modification 2, the series resonator 111s of the first filter 11 is defined by two serially connected series resonators 111b and 111c.

In the multiplexer 1 according to modification 2 of preferred embodiment 1, the total number of reflection electrode fingers of each of the series resonators 111b and 111c is smaller than the total number of reflection electrode fingers of each of the resonators 112s to 114s, 112p, and 113p. The total number of reflection electrode fingers of the series resonator 111b and the total number of reflection electrode fingers of the series resonator 111c may be the same as each other or may be different from each other.

Thus, a response generated in the stop band of the first filter 11 can be effectively reduced or prevented.

Preferred Embodiment 2

In a multiplexer 1 of preferred embodiment 2 of the present invention, a first filter 11A preferably includes a 7L-type ladder filter structure in contrast to the first filter 11 of preferred embodiment 1 which has a T-type ladder filter structure.

Figure 12:
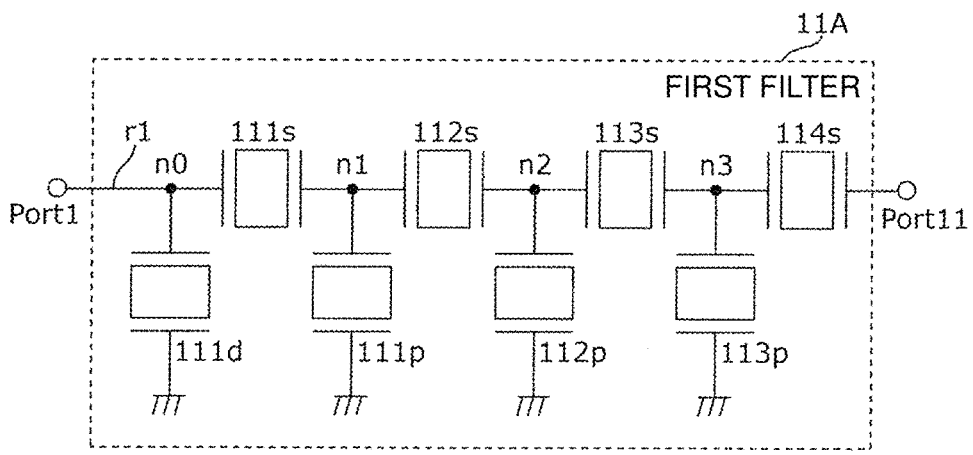
FIG. 12 is a circuit configuration diagram illustrating a first filter of a multiplexer according to preferred embodiment 2 of the present invention.

FIG. 12 is a circuit configuration diagram of the first filter 11A of the multiplexer 1 according to preferred embodiment 2. As illustrated in FIG. 12, the first filter 11A includes series resonators 111s to 114s and parallel resonators 111d and 111p to 113p.

The series resonators 111s to 114s are connected in series with each other in this order from the side where the common terminal Port 1 is provided on the first path (series arm) r1 connected between the common terminal Port 1 and the first terminal Port 11. The parallel resonator 111d is connected on a path (parallel arm) connected between a node n0 between the common terminal Port 1 and the series resonator 111s, and a reference terminal (ground). Specifically, the parallel resonator 111d, which is closest to the common terminal Port 1, is connected to the common terminal Port 1 without any of the series resonators 111s to 114s interposed therebetween. Furthermore, the parallel resonators 111p to 113p are connected in parallel with each other on paths connected between nodes n1, n2, and n3, which are located between adjacent series resonators 111s to 114s on the first path r1, and reference terminals.

Thus, the first filter 11A includes a 7L-type ladder filter structure including one or more series resonators on the first path r1 (for example, the four series resonators 111s to 114s) and two or more parallel resonators on paths connected between the first path r1 and reference terminals (for example, the four parallel resonators 111d and 111p to 113p).

In the first filter 11A, the total number of reflection electrode fingers of at least one of the parallel resonator 111d and the series resonator 111s is smaller than the total number of reflection electrode fingers of each of the resonators 112s to 114s and 111p to 113p. Here, the series resonator 111s is an example of a first series resonator, the parallel resonator 111d is an example of a first parallel resonator, and the resonators 112s to 114s and 111p to 113p are examples of the remaining resonators.

A response generated in the stop band of the first filter 11A can be reduced or prevented by using the above-described configuration for at least one of the parallel resonator 111d and the series resonator 111s, which more strongly affect the second filter 21, of the series resonators 111s to 114s and the parallel resonators 111d and 111p to 113p of the first filter 11A.

Furthermore, in the first filter 11A, the total number of reflection electrode fingers of the parallel resonator 111d and the total number of reflection electrode fingers of the series resonator 111s may both be smaller than the total number of reflection electrode fingers of each of the remaining resonators 112s to 114s and 111p to 113p. The total number of reflection electrode fingers of the parallel resonator 111d and the total number of reflection electrode fingers of the series resonator 111s may be the same as each other or may be different from each other.

A response generated in the stop band of the first filter can be further reduced or prevented by adopting the above-described configuration for both the parallel resonator 111d and the series resonator 111s, which affect the second filter 21, of the series resonators 111s to 114s and the parallel resonators 111d and 111p to 113p of the first filter 11A.

Modification 1 of Preferred Embodiment 2

In a multiplexer 1 according to modification 1 of preferred embodiment 2, a parallel resonator 111d of a first filter 11A is defined by divided resonators.

Figure 13:
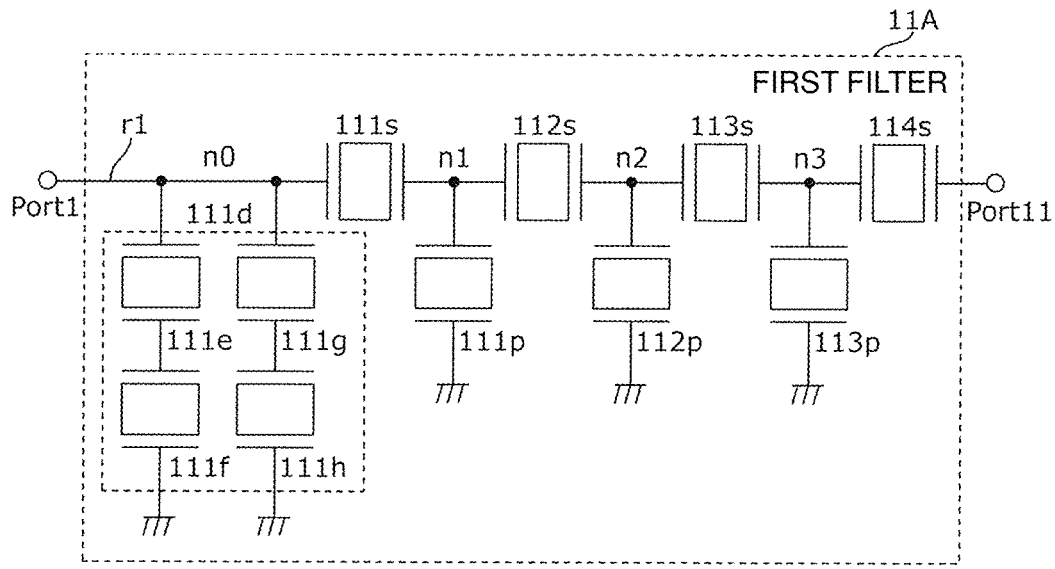
FIG. 13 is a circuit configuration diagram of a first filter according to modification 1 of preferred embodiment 2 of the present invention.

FIG. 13 is a circuit configuration diagram of the first filter 11A according to modification 1 of preferred embodiment 2. As illustrated in FIG. 13, in the first filter 11A, serially connected resonators 111e and 111f and serially connected resonators 111g and 111h are connected in parallel with each other and together define the parallel resonator 111d.

In the multiplexer 1 according to modification 1 of preferred embodiment 2, the total number of reflection electrode fingers of each of the resonators 111e to 111h of the parallel resonator 111d is smaller than the total number of reflection electrode fingers of each of the resonators 112s to 114s and 111p to 113p. The total numbers of reflection electrode fingers of the resonators 111e to 111h may be the same as each other or different from each other.

Thus, a response generated in the stop band of the first filter 11A can be effectively reduced or prevented.

Preferred Embodiment 3

The multiplexers according to preferred embodiments 1 and 2 and the modifications thereof described above can also be applied to a radio-frequency front end circuit and to a communication device that includes such a radio-frequency front end circuit. Accordingly, such a radio-frequency front end circuit and such a communication device will be described in preferred embodiment 3 of the present invention.

Figure 14:
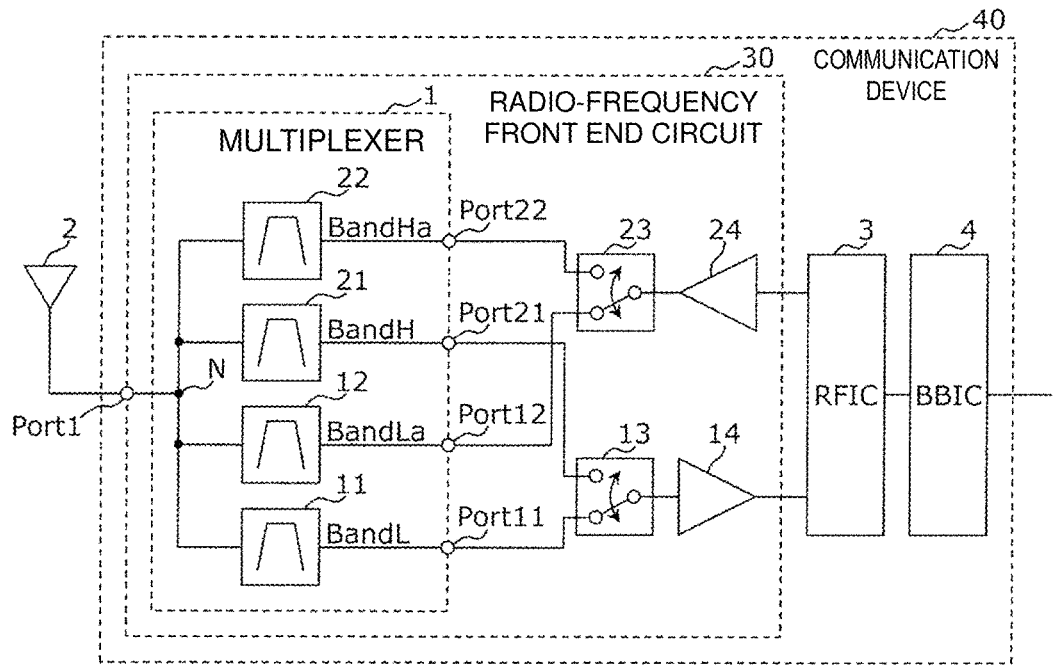
FIG. 14 is a configuration diagram of a radio-frequency front end circuit according to preferred embodiment 3 of the present invention.

FIG. 14 is a configuration diagram of a radio-frequency front end circuit 30 according to preferred embodiment 3. The figure also illustrates an antenna element 2, an RF signal processing circuit (RFIC) 3, and a baseband signal processing circuit (BBIC) 4, which are connected to the radio-frequency front end circuit 30. A communication device 40 is defined by the radio-frequency front end circuit 30, the RF signal processing circuit 3, and the baseband signal processing circuit 4.

The radio-frequency front end circuit 30 preferably includes the multiplexer 1 according to preferred embodiment 1, a reception switch 13 and a transmission switch 23, a low-noise amplifier circuit 14, and a power amplifier circuit 24.

The multiplexer 1 preferably includes four filters. Specifically, the multiplexer 1 includes a filter 12 and a filter 22 in addition to the first filter 11 and the second filter 21. The filter 12 is a transmission filter that has an uplink frequency band (transmission band) as the pass band thereof and is on a path connected between the common terminal Port 1 and an individual terminal Port 12. The filter 22 is a transmission filter that has an uplink frequency band (transmission band) as the pass band thereof and is on a path connected between the common terminal Port 1 and an individual terminal Port 22.

The reception switch 13 is a switch circuit that includes two selection terminals that are individually connected to the first terminal Port 11 and the second terminal Port 21, which are output terminals of the multiplexer 1, and a common terminal that is connected to the low-noise amplifier circuit 14.

The transmission switch 23 is a switch circuit that includes two selection terminals that are individually connected to the individual terminals Port 12 and Port 22, which are input terminals of the multiplexer 1, and a common terminal that is connected to the power amplifier circuit 24.

The reception switch 13 and the transmission switch 23 each connect the common terminal thereof and a signal path corresponding to a prescribed band to each other in accordance with a control signal from a controller (not illustrated) and are preferably, for example, each defined by a single pole double throw (SPDT) switch. The total number of selection terminals connected to the common terminal is not limited to one and may be a plurality. In other words, the radio-frequency front end circuit 30 may support carrier aggregation.

The low-noise amplifier circuit 14 is a reception amplification circuit that amplifies a radio-frequency signal (in this case, radio-frequency reception signal) received via the antenna element 2, the multiplexer 1, and the reception switch 13 and outputs the amplified signal to the RF signal processing circuit 3.

The power amplifier circuit 24 is transmission amplification circuit that amplifies a radio-frequency signal (here, radio-frequency transmission signal) output from the RF signal processing circuit 3 and outputs the amplified radio-frequency signal to the antenna element 2 via the transmission switch 23 and the multiplexer 1.

The RF signal processing circuit 3 subjects a radio-frequency reception signal input thereto from the antenna element 2 via a reception signal path to signal processing using down conversion and so forth, and outputs the reception signal generated through this signal processing to the baseband signal processing circuit 4. In addition, the RF signal processing circuit 3 subjects a transmission signal input from the baseband signal processing circuit 4 to signal processing using up conversion and so forth and outputs a radio-frequency transmission signal generated through this signal processing to the power amplifier circuit 24. The RF signal processing circuit 3 is preferably an RFIC, for example.

A signal processed by the baseband signal processing circuit 4 is used for image display as an image signal or for a phone call as an audio signal, for example.

The radio-frequency front end circuit 30 may include other circuit elements between the above-described constituent elements.

The radio-frequency front end circuit 30 and communication device 40 include the multiplexer 1 according to preferred embodiment 1 described above and therefore can reduce or prevent a stop band response generated outside the pass band of the first filter 11 and can reduce or prevent insertion loss generated inside the pass band of the second filter 21.

The radio-frequency front end circuit 30 may include the first filter 11 of modification 1 of preferred embodiment 1 or the first filter 11A according to preferred embodiment 2 or modification 1 of preferred embodiment 2 instead of the first filter 11 of the multiplexer 1 according to preferred embodiment 1.

In addition, depending on the radio-frequency signal processing method used, the communication device 40 may not have to include the baseband signal processing circuit 4.

Other Preferred Embodiments

Multiplexers, radio-frequency front end circuits, and communication devices according to preferred embodiments of the present invention have been described above in the form of preferred embodiments and modifications thereof, but other preferred embodiments provided by combining any of the constituent elements of the above-described preferred embodiments and modifications with one another, modifications obtained by modifying the above-described preferred embodiments in various ways, as thought of by one skilled in the art, without departing from the gist of the present invention, and various devices having a radio-frequency front end circuit and a communication device according to the present invention built thereinto are also included in the scope of the present invention.

For example, a multiplexer that includes four filters has been described as an example in preferred embodiment 3 above, but, for example, the present invention can also be applied to a triplexer in which the antenna terminals of three filters are connected together to define a common connection or a hexaplexer in which the antenna terminals of six filters are connected together to define a common connection. In other words, it is sufficient that the multiplexer include at least two filters.

Furthermore, an example in which both the first filter and the second filter are reception filters has been described in preferred embodiment 1. However, as long as there is a multiplexer in which the stop band response of a first filter is located inside the pass band of a second filter, the present invention can be applied to the multiplexer without there being limitations on the uses of the first and second filters and so on. Therefore, at least either one of the first and second filters may be a reception filter. The multiplexer is not limited to having a configuration that includes both a transmission filter and a reception filter, and may instead have a configuration that includes only transmission filters or only reception filters.

Furthermore, an example in which the resonator 110 does not include offset electrode fingers (electrode that faces electrode fingers and protrudes from busbar electrode on the opposite side) has been described in preferred embodiment 1, but the present invention is not limited to this example and each resonator may include offset electrode fingers.

Furthermore, the materials defining the adhesive layer 324, the main electrode layer 325, and the protective layer 326 of the IDT electrode 32 and the reflectors 32c are not limited to the materials described above. In addition, the IDT electrode 32 does not have to have a multilayer structure. For example, the IDT electrode 32 may be made of a metal such as Ti, Al, Cu, Pt, Au, Ag, or Pd or an alloy of such a metal, and may be defined by a plurality of multilayer bodies made of such metals or alloys. In addition, the protective layer 326 does not have to be provided.

Furthermore, in the substrate 320 of the resonator 110 of preferred embodiment 1, the high-acoustic-velocity support substrate 329 may have a structure in which a support substrate and a high-acoustic-velocity film, in which the acoustic velocity of a propagating bulk wave is higher than that of an acoustic wave such as a surface acoustic wave or a boundary acoustic wave propagating along the piezoelectric layer 327, are stacked one on top of the other.

Furthermore, an example in which the IDT electrode 32 of the first filter 11 is on the substrate 320 including the piezoelectric layer 327 has been described in preferred embodiment 1, but the substrate on which the IDT electrode 32 is provided may instead be a piezoelectric substrate composed of a single layer including the piezoelectric layer 327. The piezoelectric substrate in this case is for example composed of a LiTaO$_3$ piezoelectric single crystal or another piezoelectric single crystal such as LiNbO$_3$. In addition, so long as the substrate 320 on which the IDT electrode 32 is provided exhibits piezoelectricity, a structure in which a piezoelectric layer is stacked on a support substrate may instead be used for the substrate 320 rather than the substrate 320 completely including a piezoelectric layer.

In addition, a 50° Y cut X propagation LiTaO$_3$ single crystal is used as the piezoelectric layer 327 in preferred embodiment 1, but the cut angle of the single crystal material is not limited to this example. In other words, the multilayer structure, material, and thickness may be changed as appropriate in accordance with the required bandpass characteristics of the acoustic wave filter device and the same effects can be realized with an acoustic wave filter that uses a LiTaO$_3$ piezoelectric substrate or a LiNbO$_3$ piezoelectric substrate having a different cut angle.

A multiplexer according to a preferred embodiment of the present invention includes a common terminal, a first terminal, a second terminal, a first filter that is on a first path connected between the common terminal and the first terminal and includes a plurality of acoustic wave resonators, and a second filter that is on a second path connected between the common terminal and the second terminal and that has a pass band located at a higher frequency than that of the first filter. The plurality of acoustic wave resonators includes two or more series resonators on the first path and one or more parallel resonators on paths connected between nodes on the first path and ground. A first series resonator that is closest to the common terminal among the two or more series resonators is connected to the common terminal without any of the parallel resonators interposed therebetween. The plurality of acoustic wave resonators each include a substrate exhibiting piezoelectricity, an IDT electrode including a pair of comb-shaped electrodes on the substrate, and reflectors each including one or more reflection electrode fingers. A total number of reflection electrode fingers of at least one of the first series resonator and a first parallel resonator that is closest to the common terminal among the one or more parallel resonators is smaller than a total number of reflection electrode fingers of a remainder of the plurality of acoustic wave resonators.

The stop band response of at least one of the first series resonator and the first parallel resonator, which greatly affect the second filter, can be reduced or prevented by making the total number of reflection electrode fingers of at least one of the first series resonator and the first parallel resonator smaller than the total number of reflection electrode fingers of each of the remainder of the plurality of acoustic wave resonators in this way. Thus, a response generated in the stop band of the first filter can be effectively reduced or prevented and the insertion loss in the pass band of the second filter can be reduced.

In addition, the total number of reflection electrode fingers of the first series resonator and the total number of reflection electrode fingers of the first parallel resonator may be smaller than the total number of reflection electrode fingers of each of the remainder of the plurality of acoustic wave resonators.

The stop band responses of both the first series resonator and the first parallel resonator, which affect the second filter, can be reduced or prevented by making the total number of reflection electrode fingers of both the first series resonator and the first parallel resonator smaller than the total number of reflection electrode fingers of each of the remaining acoustic wave resonators. Thus, a response generated in the stop band of the first filter can be effectively reduced or prevented and the insertion loss in the pass band of the second filter can be reduced.

An aspect preferred embodiment of the present invention provides a multiplexer that includes a common terminal, a first terminal, a second terminal, a first filter that is on a first path connected between the common terminal and the first terminal and includes a plurality of acoustic wave resonators, and a second filter that is on a second path connected between the common terminal and the second terminal and that has a pass band located at a higher frequency than that of the first filter. The plurality of acoustic wave resonators includes one or more series resonators on the first path and two or more parallel resonators on paths connected between the first path and ground. The two or more parallel resonators include a first parallel resonator that is located on a side where the common terminal is provided and a parallel resonator that is located on a side where the first terminal is provided as seen from a first series resonator that is closest to the common terminal among the one or more series resonators. The plurality of acoustic wave resonators each include a substrate exhibiting piezoelectricity, an IDT electrode including a pair of comb-shaped electrodes on the substrate, and reflectors each including one or more reflection electrode fingers. A total number of reflection electrode fingers of at least one of the first parallel resonator and the first series resonator is smaller than a total number of reflection electrode fingers of each of a remainder of the plurality of the acoustic wave resonators.

The stop band response of at least one of the first parallel resonator and the first series resonator, which greatly affect the second filter, can be reduced or prevented by making the total number of reflection electrode fingers of at least one of the first parallel resonator and the first series resonator smaller than the total number of reflection electrode fingers of each of the remaining acoustic wave resonators. Thus, a response generated in the stop band of the first filter can be effectively reduced or prevented and the insertion loss in the pass band of the second filter can be reduced.

In addition, the total number of reflection electrode fingers of the first parallel resonator and the total number of reflection electrode fingers of the first series resonator may be smaller than the total number of reflection electrode fingers of each of the remainder of the plurality of acoustic wave resonators.

The stop band response of both of the first parallel resonator and the first series resonator, which affect the second filter, can be reduced or prevented by making the total number of reflection electrode fingers of both the first parallel resonator and the first series resonator smaller than the total number of reflection electrode fingers of each of the remainder of the plurality of acoustic wave resonators. Thus, a response generated in the stop band of the first filter can be effectively reduced or prevented and the insertion loss in the pass band of the second filter can be reduced.

In addition, the substrate may include a piezoelectric layer that includes the IDT electrode on one main surface thereof, a high-acoustic-velocity support substrate in which an acoustic velocity of a propagating bulk wave is higher than an acoustic velocity of an acoustic wave propagating along the piezoelectric layer, and a low-acoustic-velocity film that is arranged between the high-acoustic-velocity support substrate and the piezoelectric layer and in which an acoustic velocity of a propagating bulk wave is lower than an acoustic velocity of an acoustic wave propagating along the piezoelectric layer.

Thus, the Q value of each resonator including an IDT electrode on a substrate including a piezoelectric layer can be maintained at a high value.

Furthermore, a frequency of a stop band response generated by the first filter may be included in a frequency pass band of the second filter.

Thus, a response generated in the stop band of the first filter can be reduced or prevented and the insertion loss in the pass band of the second filter can be reduced.

In addition, a radio-frequency front end circuit according to an aspect of the present invention includes any one of the multiplexers described above; and an amplification circuit that is connected to the multiplexer.

Thus, a radio-frequency front end circuit can be provided that can reduce or prevent a response generated in a stop band of the first filter and can reduce pass band insertion loss in the second filter.

In addition, a communication device according to a preferred embodiment of the present invention includes an RF signal processing circuit that processes a radio-frequency signal transmitted or received by an antenna element, and the above-described radio-frequency front end circuit, which transmits the radio-frequency signal between the antenna element and the RF signal processing circuit.

Thus, a communication device can be provided that can reduce or prevent a response generated in the stop band of the first filter and can reduce insertion loss in the pass band of the second filter.

Preferred embodiments of the present invention can be widely applied to communication devices such as mobile phones in the form of a multiplexer, a front end circuit, and a communication device applicable to multi-band systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal;
a first terminal;
a second terminal;
a first filter that is on a first path connected between the common terminal and the first terminal and that includes a plurality of acoustic wave resonators; and
a second filter that is on a second path connected between the common terminal and the second terminal and that has a pass band located at a higher frequency than a pass band of the first filter; wherein
the plurality of acoustic wave resonators include:
two or more series resonators on the first path; and
one or more parallel resonators on paths connected between nodes on the first path and ground;
a first series resonator that is closest to the common terminal among the two or more series resonators is connected to the common terminal without any of the parallel resonators interposed therebetween;
the plurality of acoustic wave resonators each include a substrate that exhibits piezoelectricity, an InterDigital Transducer (IDT) electrode including a pair of comb-shaped electrodes on the substrate, and reflectors each including one or more reflection electrode fingers; and
a total number of reflection electrode fingers of at least one of the first series resonator and a first parallel resonator that is closest to the common terminal among the one or more parallel resonators is smaller than a total number of reflection electrode fingers of at least one of a remainder of the plurality of acoustic wave resonators.

2. The multiplexer according to claim 1,
wherein the total number of reflection electrode fingers of at least one of the first series resonator and the first parallel resonator is smaller than a total number of reflection electrode fingers of each of the remainder of the plurality of acoustic wave resonators.

3. The multiplexer according to claim 1,
wherein the total number of reflection electrode fingers of the first series resonator and the total number of reflection electrode fingers of the first parallel resonator are smaller than the total number of reflection electrode fingers of at least one of the remainder of the plurality of acoustic wave resonators.

4. The multiplexer according to claim 3,
wherein the total number of reflection electrode fingers of the first series resonator and the total number of reflection electrode fingers of the first parallel resonator are smaller than a total number of reflection electrode fingers of each of the remainder of the plurality of acoustic wave resonators.

5. The multiplexer according to claim 1, wherein
the substrate of the plurality of acoustic wave resonators includes:
a piezoelectric layer including the IDT electrode on one main surface thereof;
a high-acoustic-velocity support substrate in which an acoustic velocity of a propagating bulk wave is higher than an velocity of an acoustic wave propagating along the piezoelectric layer, and
a low-acoustic-velocity film that is between the high-acoustic-velocity support substrate and the piezoelectric layer and in which an acoustic velocity of a propagating bulk wave is lower than an acoustic velocity of an acoustic wave propagating along the piezoelectric layer.

6. The multiplexer according to claim 1, wherein a frequency of a stop band response generated by the first filter is included in a frequency pass band of the second filter.

7. A radio-frequency front end circuit comprising: the multiplexer according to claim 1; and an amplification circuit that is connected to the multiplexer.

8. A communication device comprising: an RF signal processing circuit that processes a radio-frequency signal transmitted or received by an antenna element; and the radio-frequency front end circuit according to claim 7, which transmits the radio-frequency signal between the antenna element and the RF signal processing circuit.

9. The radio-frequency front end circuit according to claim 7, wherein the amplification circuit includes a reception switch, a transmission switch, a low-noise amplifier circuit, and a power amplifier circuit.

10. The multiplexer according to claim 1, wherein the first filter is defined by a reception filter which uses a downlink frequency band in a low band as the pass band; and the second filter is defined by a reception filter that uses a downlink frequency band in a high band as the pass band.

11. The multiplexer according to claim 1, wherein an impedance matching inductor is connected to an end of the first filter.

12. The multiplexer according to claim 1, wherein the second filter includes longitudinally-coupled surface acoustic wave resonators.

13. A multiplexer comprising:
a common terminal;
a first terminal;
a second terminal;
a first filter that is on a first path connected between the common terminal and the first terminal and that includes a plurality of acoustic wave resonators; and
a second filter that is on a second path connected between the common terminal and the second terminal and that has a pass band located at a higher frequency than a pass band of the first filter; wherein
the plurality of acoustic wave resonators includes:
 one or more series resonators on the first path; and
 two or more parallel resonators on paths connected between the first path and ground;

the two or more parallel resonators include a first parallel resonator that is located on a side where the common terminal is provided and a parallel resonator that is located on a side where the first terminal is provided as seen from a first series resonator that is closest to the common terminal among the one or more series resonators;
the plurality of acoustic wave resonators each include a substrate that exhibits piezoelectricity, an InterDigital Transducer (IDT) electrode including of a pair of comb-shaped electrodes on the substrate, and reflectors each including one or more reflection electrode fingers; and
a total number of reflection electrode fingers of at least one of the first parallel resonator and the first series resonator is smaller than a total number of reflection electrode fingers of at least one of a remainder of the plurality of acoustic wave resonators.

14. The multiplexer according to claim 13, wherein the total number of reflection electrode fingers of the at least one of the first parallel resonator and the first series resonator is smaller than a total number of reflection electrode fingers of each of the remainder of the plurality of acoustic wave resonators.

15. The multiplexer according to claim 13, wherein the total number of reflection electrode fingers of the first parallel resonator and the total number of reflection electrode fingers of the first series resonator are smaller than the total number of reflection electrode fingers of at least one of the remainder of the plurality of acoustic wave resonators.

16. The multiplexer according to claim 15, wherein the total number of reflection electrode fingers of the first parallel resonator and the total number of reflection electrode fingers of the first series resonator are smaller than a total number of reflection electrode fingers of each of the remainder of the plurality of acoustic wave resonators.

17. A radio-frequency front end circuit comprising: the multiplexer according to claim 13; and an amplification circuit that is connected to the multiplexer.

18. A communication device comprising: an RF signal processing circuit that processes a radio-frequency signal transmitted or received by an antenna element; and the radio-frequency front end circuit according to claim 17, which transmits the radio-frequency signal between the antenna element and the RF signal processing circuit.

* * * * *